United States Patent [19]
Fant et al.

[11] Patent Number: 6,031,390
[45] Date of Patent: Feb. 29, 2000

[54] ASYNCHRONOUS REGISTERS WITH EMBEDDED ACKNOWLEDGE COLLECTION

[75] Inventors: Karl M. Fant, Minneapolis; David A. Parker, St. Paul, both of Minn.

[73] Assignee: Theseus Logic, Inc., Orlando, Fla.

[21] Appl. No.: 08/991,141

[22] Filed: Dec. 16, 1997

[51] Int. Cl.$^7$ .......................... H03K 19/23; H03K 19/00
[52] U.S. Cl. .............................. 326/36; 326/59; 326/136; 327/185; 365/78
[58] Field of Search .................................. 326/35, 36, 59, 326/60, 136; 327/185, 202, 203, 205, 206, 219; 235/61 PC; 365/78

[56] References Cited

U.S. PATENT DOCUMENTS

| | | | |
|---|---|---|---|
| 3,610,950 | 10/1971 | Keller et al. ............................... | 326/11 |
| 3,715,603 | 2/1973 | Lerch . | |
| 4,845,633 | 7/1989 | Furtek . | |
| 5,121,003 | 6/1992 | Williams . | |
| 5,305,463 | 4/1994 | Fant et al. . | |
| 5,382,844 | 1/1995 | Knauer . | |
| 5,652,902 | 7/1997 | Fant ..................................... | 235/61 PC |
| 5,656,948 | 8/1997 | Sobelman et al. ......................... | 326/35 |
| 5,764,081 | 6/1998 | Fant et al. ................................ | 326/63 |

FOREIGN PATENT DOCUMENTS

| | | |
|---|---|---|
| 0 566 739 A1 | 10/1993 | European Pat. Off. . |
| 0 570 584 A1 | 11/1993 | European Pat. Off. . |
| 0 578 821 A1 | 1/1994 | European Pat. Off. . |
| WO 92/12498 | 7/1992 | WIPO . |
| WO 92/16971 | 10/1992 | WIPO . |
| WO 94/03929 | 2/1994 | WIPO . |

OTHER PUBLICATIONS

Anantharaman, "A delay insensitive regular expression recognizer," research paper, Dept. of Computer Science, Carnegie–Mellon University, pp. 1–10 (Jan. 1989).

Brzozowski et al., "Asynchronous Circuits," Table of Contents, 20 pgs. (1995).

Burford et al., "An 180 Mhz 16 bit Multiplier Using Asynchronous Logic Design Techniques," *IEEE 1994 Custom Integrated Circuits Conference*, pp. 215–218 (1994).

Dean, "Strip: A Self–Timed Risk Protector," Dissertation, *STRiP's Implementation*, Computer Systems Laboratory, Stanford University, pp. 108–114 and 145–147 (Jul. 1992).

Greenstreet et al., "Self–Timed Iteration," *Elsevier Science Publishers B.V. (North Holland)*, pp. 309–322 (1988).

Hampel et al., "Threshold logic," *IEEE Spectrum*, pp. 32–39 (May 1971).

(List continued on next page.)

*Primary Examiner*—Michael Tokar
*Assistant Examiner*—Richard Roseen
*Attorney, Agent, or Firm*—Steptoe & Johnson LLP

[57] ABSTRACT

An asynchronous register with embedded acknowledge collection is disclosed. The asynchronous register includes a data threshold circuit for generating data or NULL values at an output signal line based upon an evaluation of at least one data input value and an acknowledgment collection circuit, embedded in the data threshold circuit, for collecting a plurality of acknowledge signals and resolving the acknowledge signals for controlling, in combination with the at least one data input value, the passing of the data or NULL values to the output signal line. The acknowledgment collection circuit includes an M of N acknowledge collection circuit, wherein N is an integer representing the number of acknowledge signals being resolved and M representing a threshold, wherein $M \leq N$. The M of N acknowledge collection circuit allows the data input values to pass as data to the output signal line after M acknowledge signals assert a request for data and allows the data input values to pass as NULL to the output signal line after P acknowledge signals assert a request for NULL, wherein $P \leq N$. P may or may not be equal to M. A reset network is provided for providing system initialization at registration boundaries and is made transparent during normal operating conditions.

11 Claims, 9 Drawing Sheets

OTHER PUBLICATIONS

Heller et al., "Session I: Custom and Semi–Custom Design Techniques —WAM 1.3: Cascode Voltage Switch Logic: A Differential CMOS Logic Family," *IEEE International Solid State Circuit Conference*, 2 pgs. (1984).

Mead et al., "Introduction to VLSI Systems," *Addison–Wesley Series in Computer Science*, pp. 242–262 (1980).

Meng et al., "Automatic Synthesis of Asynchronous Circuits from High–Level Specifications," *IEEE Transactions on Computer–Aided Design*, vol. 8, No. 11, pp. 1185–1205 (Nov. 1989).

Muller, "Asynchronous Logics and Application to Information Processing," *Switching Theory in Space Technology*, pp. 289–297 (1963).

Nielsen et al., "A low–power Asynchronous Data–path for a FIR filter bank," *IEEE*, pp. 198–207 (1996).

Renaudin et al., "The Design of Fast Asynchronous Adder Structures and Their Implementation Using D.C.V.S. Logic," *International Symposium on Circuits and Systems*, vol. 4, pp. 291–294 (undated).

Shibata et al., "A Functional MOS Transistor Featuring Gate–Level Weighted Sum and Threshold Operations," *IEEE Transactions on Electron Devices*, vol. 39, No. 6, pp. 1444–1455 (Jun. 1992).

Singh, "A Design Methodology for Self–Timed Systems," Thesis, *Massachussetts Institute of Technology*, pp. 1–98 (Feb. 1981).

Sparso et al., "Design of delay insensitive circuits using multi–ring structures," EURO–DAC '92 European Design Automation Conference, *IEEE*, pp. 15–20 (1992).

Sparso et al., "Delay–insensitive multi–ring structures," *Integration, the VLSI journal 15*, pp. 313–340 (1993).

Sutherland, "Micropipelines," *Communications of the ACM*, vol. 32, No. 6, pp. 720–738 (Jun. 1989).

Unger, "Asynchronous Sequential Switching Circuits," Chapter 6, *Department of Electrical Engineering, Columbia University*, pp. 221–229 (1969).

Williams, "Latency and Throughput Tradeoffs in Self–Timed Speed–Independent Pipelines and Rings," *Technical Report No. CSL–TR–90–431, Computer Systems Laboratory, Stanford University*, pp. 1–26 (Aug. 1990).

Williams, "Self–Timed Rings and Their Application to Division / Chapters 1–7," *Technical Report No CSL–TR–91–482, Computer Systems Laboratory, Stanford University*, pp. 1–144 (May 1991).

Wojcik et al., "On the Design of Three–Valued Asynchronous Modules," *IEEE Transactions on Computers*, vol. C — 29, No. 10, pp. 889–898 (Oct. 1980).

Wuu et al., "Transaction Brief —A Design of a Fast and Area Efficient Multi–Input Muller C–element," *IEEE Transactions on Very Large Scale Integration (VLSI) Systems*, vol. 1, No. 2, pp. 215–219 (Jun. 1993).

ASYNCHRONOUS REGISTERS WITH EMBEDDED ACKNOWLEDGE COLLECTION

BACKGROUND OF THE INVENTION

1. Field of the Invention

This invention relates in general to threshold gates, and more particularly to asynchronous registers with embedded acknowledge collection.

2. Description of Related Art

Traditional logic systems, such as synchronous Boolean logic systems, typically employ clocking signals to regulate the sequential processing of binary logic signals. Typically, a digital logic circuit will respond to multiple inputs to generate an output. As input logic signals propagate through the sequential circuit, the sequential circuit output is unreliable for a period of time corresponding to worst case propagation delays through the individual logic gates. Typically, the output signal is sampled at a time when the output is stable, often by latching the output into a register. The sampling time is controlled by an independent clock source, i.e., one that is not derived from the states of the logic gates themselves.

Traditional Boolean logic has the disadvantage that it is not symbolically complete. Among its component elements, a traditional Boolean logic circuit exhibits time-dependent relationships, as well as symbolic-value-dependent relationships. The symbolic-value-dependent relationships depend on the interconnection of the logic gates. The time-dependent relationships depend on the propagation delay times of the logic gates. These two aspects of process expression are independent and require careful and explicit coordination to provide a complete and correct expression of a process. A carefully engineered Boolean logic circuit with its clock is a complete process expression, but it is not a symbolically complete expression.

While synchronous circuits have become the dominant logic class, a substantial amount of design time and analysis is necessary to avoid a variety of timing-related problems, such as race conditions and clock skew. Designers must build in timing margins to ensure that the circuit operates correctly which, in turn, decreases the maximum processing rate of the circuit. Furthermore, the fraction of power and die area that must be devoted to the clocking circuitry is substantial, and, in certain instances, has limited the total amount of circuitry that can be integrated onto a single chip.

The expression of both time-dependent and symbolic-value-dependent relationships can be integrated into an expression purely in terms of symbolic-value-dependent relationships with no external control expression. This expression is symbolically complete because it is completely expressed and completely determined solely in terms of symbolic-value-dependent relationships. A symbolically complete logic circuit has no time relationships and is completely insensitive to the propagation delays among its component elements. NULL convention logic provides a method for the design of symbolically complete logic circuits. A full description of NULL convention logic systems can be found in U.S. Pat. No. 5,305,463, which is incorporated here by reference.

NULL convention logic employs digital threshold gates to construct digital processing systems. Threshold gates serve as both data processing elements and data registration elements when used in NULL convention logic systems. A NULL convention asynchronous register regulates wavefront flow and interaction in sequential NULL convention circuits. NULL convention asynchronous registers produce an acknowledge signal, as well as accept incoming acknowledge signals. An incoming acknowledge signal contains information about the state of the next registration stage (the downstream circuit), while the outgoing acknowledge signal contains information about the state of the current registration stage. When the NULL convention asynchronous register receives a new acknowledge signal from the downstream circuit, the downstream circuit is ready to receive a new wavefront. Wavefronts alternate between meaningful data and NULL. Furthermore, the NULL convention asynchronous register produces a control signal which is used to request new wavefronts from the preceding circuit (the upstream circuit). A full description of NULL convention asyncronous registers can be found in U.S. Pat. No. 5,652,902, which is incorporated here by reference.

In many cases a single registration stage is acknowledged by two or more independent registration stages. In these cases, the multiple acknowledge signals must be collected and resolved to a single acknowledge signal using an explicit threshold gate. The resolved acknowledge signal is then passed to the single registration stage. The threshold gate performing the acknowledgement collection and resolution adds another processing stage which both increases the number of elements in the circuit and decreases the processing rate of the circuit.

It can be seen then that there is a need for acknowledgement collection and resolution within the NULL convention asynchronous registers.

It can also be seen that there is a need for asynchronous registers with embedded acknowledge collection for reducing the number of active elements required to perform acknowledgment collection and resolution, and for increasing the system processing throughput by reducing the number of processing stages.

SUMMARY OF THE INVENTION

To overcome the limitations in the prior art described above, and to overcome other limitations that will become apparent upon reading and understanding the present specification, the present invention discloses a NULL asynchronous register with embedded acknowledge collection and resolution.

A system in accordance with the principles of the present invention includes a NULL convention asynchronous register with embedded acknowledge collection for receiving a set of acknowledge signals from a downstream circuit that indicates: 1) the downstream circuit is ready to receive a wavefront of meaningful data; or 2) the downstream circuit is ready to receive a NULL wavefront. Therefore, the set of acknowledge signals request alternating data and NULL wavefronts. When the downstream circuit indicates it is ready to receive meaningful data, the NULL convention asynchronous register with embedded acknowledge collection allows meaningful data to pass from its input to its output and signals an upstream circuit that the NULL convention asynchronous register with embedded acknowledge collection is ready to receive a NULL wavefront. When the downstream circuit indicates it is ready to receive NULL, the NULL convention asynchronous register with embedded acknowledge collection allows NULL to pass from its input to its output and signals an upstream circuit that the NULL convention asynchronous register with embedded acknowledge collection is ready to receive meaningful data.

The present invention uses NULL convention threshold gates as regulators to control the flow of data and NULL wavefronts. The threshold gates receive a set of acknowledge signals and data signals as inputs. The threshold gate includes circuitry to resolve the set of acknowledge signals to either: 1) a request for a NULL wavefront, "request-for-NULL" (RFN); or 2) a request for a meaningful data wavefront, "request-for-data" (RFD). When the set of acknowledge signals are resolved to a RFN, the downstream circuit has indicated that it is ready to receive a NULL wavefront and a NULL is passed from the input to the output of the register. When the set of acknowledge signals are resolved to a RFD, the downstream circuit has indicated that it is ready to receive a meaningful data wavefront and a data is passed from the input to the output of the register.

The present invention includes a set/reset network for providing system initialization at registration boundaries. When the asynchronous register is initialized, the set/reset network causes the register output to be pulled to either VDD or GND. The set/reset network is transparent to the register operation during normal processing.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 3b illustrates a symbol for a three-input majority-function gate having two inputs A and B and an output Z as in FIG. 3a;

FIG. 3c illustrates a transistor-level circuit diagram of a static CMOS implementation for the NULL convention threshold gate of FIG. 3a;

FIG. 4b illustrates a symbol for a four-input function gate having three inputs A, B and C and an output Z as in FIG. 4a;

FIG. 4c illustrates a transistor-level circuit diagram of a static CMOS implementation for the gate of FIG. 4a;

DETAILED DESCRIPTION OF THE INVENTION

Figure 1:
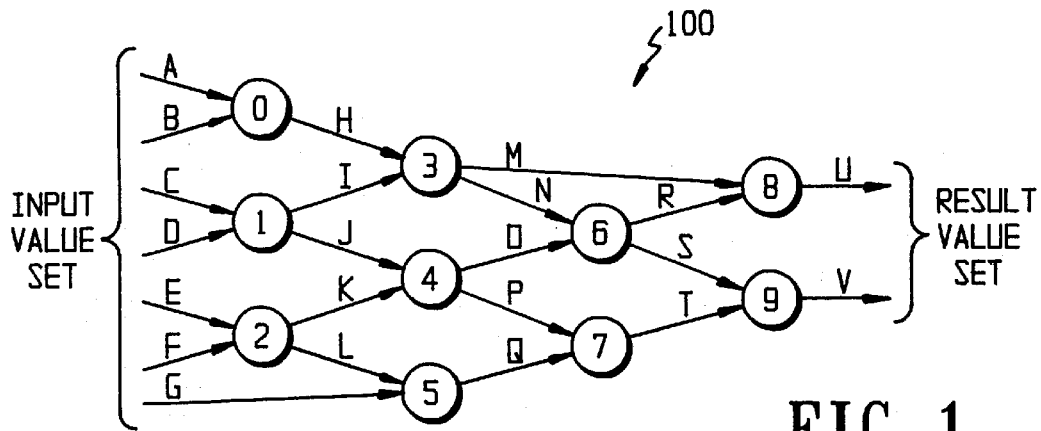
FIG. 1 illustrates a NULL convention combinational circuit.

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The invention provides asynchronous registers with embedded acknowledge collection for reducing the number of active elements required to perform acknowledgment collection and resolution, and for increasing the system processing throughput by reducing the number of processing stages.

A NULL convention combinational circuit generates a result value set in response to an input value set. An important aspect of NULL convention circuits is that any particular input or output may have a meaningful value or a NULL value which has no data meaning. The very presence of a non-NULL value indicates that the value has meaning, and no external clock is required to indicate that a value is meaningful. Further information regarding NULL convention logic can be found in above mentioned U.S. Pat. Nos. 5,305,463 and 5,652,902, which were incorporated here by reference. Certain aspects are reiterated here for convenience.

NULL convention logic differs from traditional Boolean logic where each signal line may have one of two meaningful states. In traditional logic that uses CMOS or TTL implementation, a low voltage level on a signal line means "logic false" or the number "zero." A high voltage level on the same line means "logic true" or the number "one." Thus a signal line may assume one of two values, either of which may or may not be meaningful.

NULL convention logic has multiple implementations which include a NULL state which has no data meaning. In one implementation, two separate signal lines would be used in order to convey two meaningful values. For example, logic "false" could be conveyed by asserting a high voltage on the first line and a low voltage on the second line. Logic "true" could be conveyed by asserting a low voltage on the first line and a high voltage on the second line. NULL could be conveyed by low voltage levels on both lines. It should be appreciated that in this particular embodiment high voltage levels on both lines is unused. In this embodiment, meaning is expressed according to the signal line asserted, not by the choice of voltage level. A high voltage level in this case "asserts" the meaning of the line. A low voltage level in this example is meaningless with respect to data. Those skilled in the art will recognize that other equally valid expressions, including the inversion of the voltage levels described is possible.

In another implementation, multiple voltages can be used on a single line to convey multiple meanings and NULL. For example, each signal line may be allowed to assume three voltage levels. A positive voltage level asserts the meaning "true", a negative voltage level asserts the meaning "false", and the zero voltage level is NULL (meaningless). In other implementations, parameters other than voltage may be used as long as the requisite number of states can be differentiated. Discussions here will assume an implementation in which each signal line may assume two voltage levels, with a high level asserting "meaning" and the ground voltage level being NULL. This provides voltage levels as concrete examples to aid in explanation, but the invention is not limited to these voltage-level examples.

Another important aspect of NULL convention circuits is the way that meaningful and NULL signals propagate through a combinational circuit. FIG. 1 illustrates a NULL convention combinational circuit 100. In FIG. 1, logic gates are shown as circles and labeled with numerals 0–9. Input lines are labeled with letters A–G, output lines are labeled with letters U, V, and internal connection lines are labeled with letters H–T. Signal lines are schematic, and may be individual conductors, multiple conductors or another NULL convention configuration.

Each logic gate is assumed in this discussion to require data at both inputs before it will generate data at its output. In the NULL convention circuit 100, each logic gate transitions from a NULL to a meaningful output value after all inputs have assumed meaningful values. For example, as illustrated in FIG. 1, assume that input lines A and B initially have NULL values, and logic gate zero (0) initially has a NULL output. In the case that only input line A transitions to a meaningful value (while input line B remains at NULL), logic gate zero will maintain a NULL output value. In the case that only input line B transitions to a meaningful value (while input line A remains at NULL), logic gate zero still will maintain a NULL output. When both input lines A and B transition to meaningful values (either simultaneously or sequentially), then logic gate zero (0) will change its output to a meaningful value.

The behavior described above applies to all logic gates in the NULL convention circuit 100. Logic gates zero through two, which are directly connected to input lines A–F, will provide meaningful values to the next level of gates (three through five) only when the respective inputs lines A–F have completely assumed meaningful values. This produces a general result that can be visualized as a wavefront of meaningful values propagating through the network. At the network output U and V, logic gates eight and nine will change their individual outputs from NULL to meaningful values only when all upstream gates have propagated meaningful values.

Two important characteristics should now be apparent. First, the network outputs transition from NULL to meaningful values monotonically. That is, the outputs do not switch back and forth while partial results have propagated through the intermediate gates. Second, the very presence of a meaningful value at the network output is sufficient to indicate that the network has conclusively resolved all intermediate logic operations. The very presence of a meaningful value is sufficient to indicate that the value is steady, complete, and may be used by downstream circuitry. Thus, no external clock is required to control the network's operations.

The NULL convention circuit 100 discussed here also exhibit a third characteristic; the outputs of the logic gates transition from a meaningful value to NULL only when all inputs have switched to NULL. In this way, NULL values propagate through the network monotonically, and the very presence of NULL values at the output is sufficient to indicate that all gates in the network have returned to NULL output states.

Figure 2A:
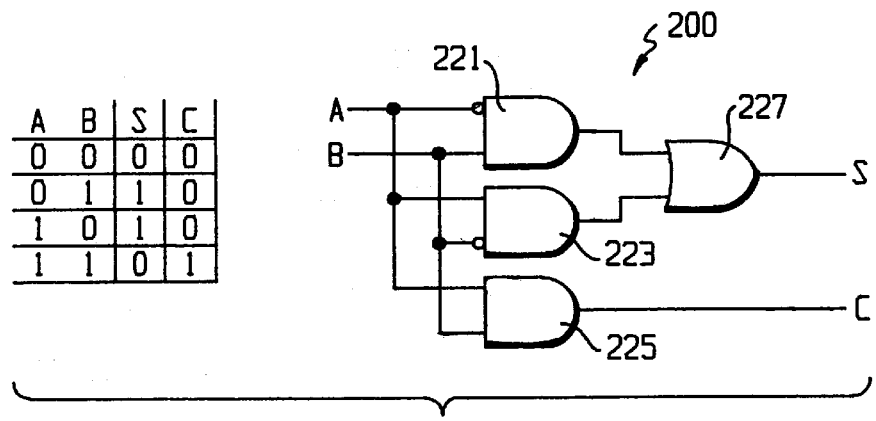
FIG. 2a illustrates a Boolean half-adder constructed of three AND gates and an OR gate.

FIG. 2a illustrates a Boolean half-adder 200 constructed of three AND gates 221, 223, 225 and an OR gate 227. The half adder has two input signal lines A and B, and two output lines S (sum) and C (carry). Each input line may assume one of two meaningful values: "zero" and "one." Each output line may assume one of two meaningful values: "zero" and "one." The half adder implements a transfer function such that:

when both inputs are "zero", sum (S) and carry (C) outputs become "zero;"

when a single input is "one" (and the other is "zero"), sum becomes "one" and carry becomes "zero;" and when both inputs are "one," sum becomes "zero" and carry becomes "one."

Figure 2B:
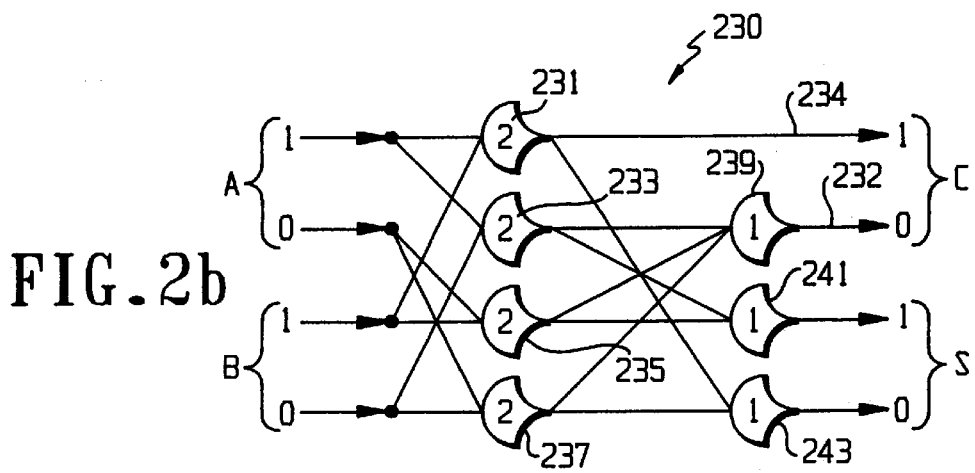
FIG. 2b illustrates a "dual-rail" NULL convention half-adder.

For comparison, FIG. 2b illustrates a "dual rail" NULL convention half adder 230. It is similar to the Boolean half-adder of FIG. 2a in that there are two inputs A and B and two outputs S and C, and it implements the same transfer function. Unlike the Boolean circuit 200, the NULL convention half-adder 230 has a separate signal line for each meaning. The carry output, for example, has two separate signal lines, each of which may assume one of two voltage levels. A first voltage level is meaningful and the other voltage level is NULL. In order to assert a meaning of "carry equals zero," the first signal line 232, designated as having a meaning "zero" when asserted, is driven to its meaningful voltage level, while the second signal line 234 is held at the NULL voltage level. In order to assert a value "carry equals one," the first signal line 232 is held at the NULL voltage level, while the second signal line 234, designated by design as having a meaning "one", is driven to the meaningful voltage level. The half-adder can also assert "carry has no meaning" by holding both carry signal lines at NULL. The half-adder is not designed in normal operation to have both carry lines at the meaningful voltage level. Similarly, the remaining inputs and outputs (A, B, S) each have a pair of signal lines. Each pair of lines is a "mutually exclusive assertion group," which means only one line of any group will be asserted (have a meaningful value) at a time.

Hereafter, when a NULL convention circuit switches a signal line to a meaningful value, it will be said that: 1) the line is "asserted"; or 2) the line asserts data. When a NULL convention circuit switches a signal line to a NULL value, it will be said that: 1) the line is NULL; or 2) the line asserts NULL.

In other design situations, mutually exclusive assertion groups may have more than two lines. A single line, by itself, can be considered a mutually exclusive assertion group.

The NULL convention half adder 230 is made of seven threshold gates 231, 233, 235, 237, 239, 241, 243. Each threshold gate has a single signal line output which may be asserted (assume a meaningful voltage level) or NULL (assume a NULL voltage level). The output signal line may fan out to several destinations. Four of the gates 231, 233, 235, 237 have two input signal lines and a threshold of two ("threshold-two gate"). The output of a threshold-two gate is asserted when two (both) of the input lines are asserted. One of the gates 239 has three input signal lines and a threshold of one ("threshold-one gate"). The output of the threshold-one gate is asserted when any one of the three inputs is asserted. Two of the gates 241, 243 have two inputs and a threshold of one. As a drawing convention, a numeral inside a threshold gate symbol indicates the number of asserted input lines needed to cause the gate to assert its output.

Each of the NULL convention gates of the half adder 230 exhibits the characteristic that it switches to a meaningful value only when the requisite number of inputs becomes meaningful, and each threshold gate holds a meaningful output value until all of the inputs become NULL. Thus, threshold gates exhibit hysteresis: as the number of asserted inputs drops below the threshold, the output remains meaningful. For example, the threshold-two gates 231, 233, 235, 237 will maintain meaningful output levels when the number of meaningful inputs drops from two to one. The threshold-two gates will only switch to NULL when all inputs become NULL.

It should be appreciated that a threshold gate forms a central building block of NULL convention logic circuits. The NULL convention threshold gates may be characterized by the number of inputs and the threshold value. They further ensure completeness of the input set, in that they switch to a NULL output only when all inputs are NULL.

Figure 3A:
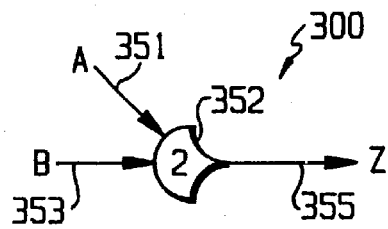
FIG. 3a illustrates a symbol for a two-input, threshold-two (two-of-two) NULL convention logic gate having inputs A and B and output Z.

FIG. 3a illustrates a threshold gate 300 wherein a symbol 352 is used to signify a two-input, threshold-two (two-of-two) NULL convention logic gate having inputs A and B and output Z. Here, each input line 351, 353 and the output line 355 each represent one signal line which is capable of assuming a meaningful value or NULL. When both input signals A, B are asserted, the output Z is asserted. After the output has been asserted, the output returns to NULL only when both inputs A, B return to NULL.

Figure 3B:
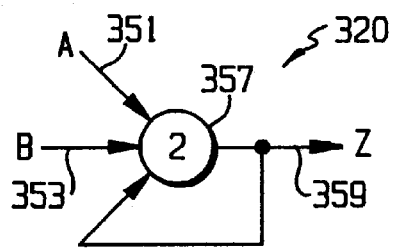

FIG. 3b illustrates a threshold gate 320 wherein a symbol 357 is used to signify a three-input majority-function gate having two inputs A and B and an output Z as in FIG. 3a. The output line 359 is fed back as an input, which conceptually provides the functionality of the two-of-two NULL convention threshold gate of FIG. 3a. In isolation (i.e., without the feedback signal), the majority-function gate operates without hysteresis. When the number of asserted inputs is greater than or equal to two, the majority function gate output is asserted. When the number of asserted inputs is less than two, the majority function gate output goes NULL.

With feedback, the majority-function gate has hysteresis. When the output Z is asserted, the feedback line provides one asserted input. If the number of asserted inputs drops to one, then the feedback line provides a second asserted input to hold the majority function gate to an asserted output. The output Z will switch to NULL only when both independent inputs A and B become NULL. Conversely, when the output Z is NULL, the feedback line provides one NULL input. The output Z will be asserted only when both independent inputs A and B are asserted.

Figure 3C:
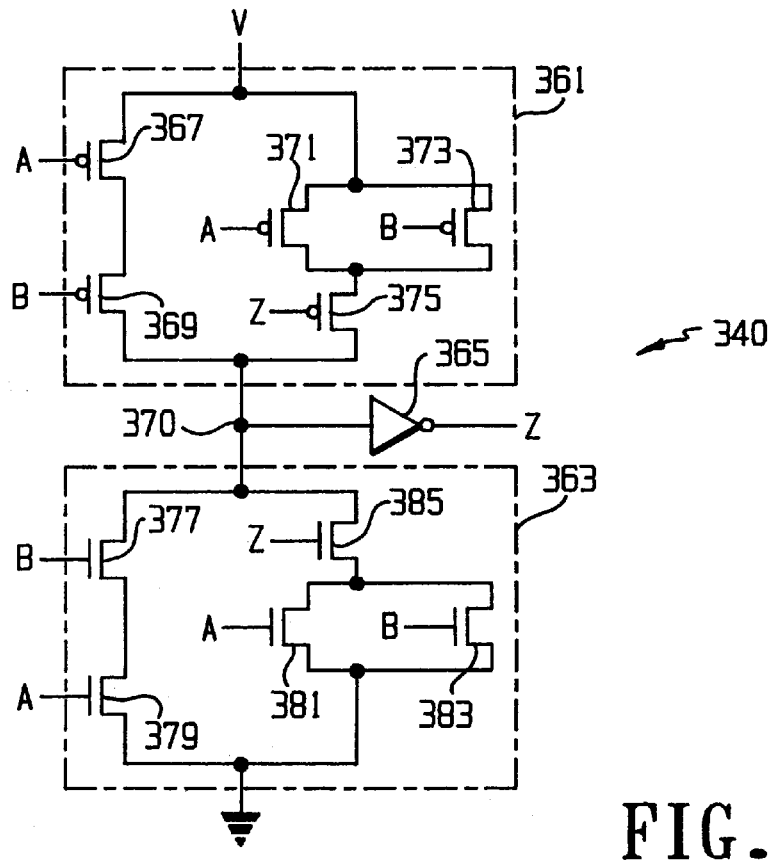

FIG. 3c illustrates a transistor-level circuit diagram 340 of a static CMOS implementation of the NULL convention threshold gate 300 of FIG. 3a. The implementation includes a pull-up sub-circuit 361, a pull-down sub-circuit 363, and a driver 365. The input to the driver 365 is taken from a signal junction 370.

The pull-up sub-circuit 361 includes a series pair of PMOS transistors 367, 369 connecting a voltage source V to a signal junction 370. The voltage source V is also connected to the signal junction 370 through a parallel pair of PMOS transistors 371, 373, which is in series with a feedback PMOS transistor 375.

The pull-down sub-circuit 363 includes a series pair of NMOS transistors 377, 379 connecting signal junction 370 to ground. The signal junction 370 is also connected to ground through a parallel pair of NMOS transistors 381, 383, which is in series with a feedback NMOS transistor 385.

One input signal A is connected to the gates of one PMOS series transistor 367, one PMOS parallel transistor 371, one NMOS series transistor 379 and one NMOS parallel transistor 381. The other input signal B is connected to the gates of one PMOS series transistor 369, one PMOS parallel transistor 373, one NMOS series transistor 377 and one NMOS parallel transistor 383. The output Z is connected to the gates of both feedback transistors 375, 385.

Operation of the circuit will assume that NULL is a voltage at or near ground, and that asserted is at or near the voltage source V. The value for the asserted voltage may be sized for the fabrication technology.

When both input signals A, B are NULL, the PMOS series transistors 367, 369 are on, the NMOS series transistors 377, 379 are off, and the signal junction 370 is pulled to the voltage source V. The driver input (which is taken from the signal junction 370) is at the source voltage level, and the driver 365 switches its output Z to NULL. The parallel PMOS transistors 371, 373 are also on, as is the PMOS feedback transistor 375. Thus, the signal junction 370 is switched to the voltage source through the parallel PMOS transistors 371, 373 as well. All of the NMOS transistors are off.

When both input signals A, B are asserted, the NMOS series transistors 377, 379 are on, the PMOS series transistors 367, 369 are off, and the signal junction 370 is pulled to ground. The driver input is at the ground voltage, and the driver 365 asserts its output. The parallel NMOS transistors 381, 383 are also on, as is the NMOS feedback transistor 385. Thus, the signal junction 370 is switched to ground through the parallel NMOS transistors 381, 383 as well. All of the PMOS transistors are off.

When one input signal is asserted and the other is NULL, one transistor of each series pair 367/369, 377/379 is on, and the other transistor is off. Thus, the series transistors do not connect the signal junction 370 either to the voltage source or to ground. But one transistor of each parallel pair 371/373, 381/383 is on. The voltage of the signal junction 370 (and thus of the output Z) is determined by the state of the feedback transistors 375, 385. If the prior output Z was NULL, the PMOS feedback transistor 375 is on, the signal junction 370 is at the source voltage, and the driver output remains NULL. If the prior output Z was asserted, the NMOS feedback transistor 385 is on, the signal junction 370 is at ground, and the driver output remains asserted.

Thus the series transistors 367, 369, 377, 379 determine the output state when both inputs are NULL and when both inputs are asserted. The feedback transistors 375, 385 provide the hysteresis when one input is asserted and the other input is NULL. The parallel PMOS transistors 371, 373 serve to disengage the PMOS feedback transistors when both inputs are asserted, and the parallel NMOS transistors 381, 383 serve to disengage the NMOS feedback transistors when both inputs are NULL.

Figure 4A:
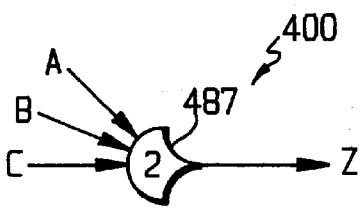
FIG. 4a illustrates a symbol for a three-input, threshold-two (two-of-three) NULL convention logic gate.
Figure 4B:
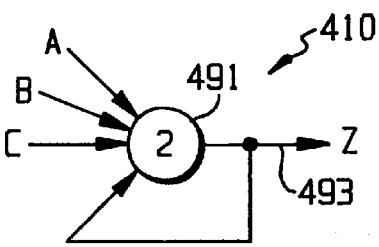

FIG. 4a illustrates a threshold gate 400 wherein a symbol 487 is used to signify a three-input, threshold-two (two-of-three) NULL convention logic gate. The drawing conventions are the same as for FIG. 3a, but with three inputs A, B, C. When two of the three inputs are asserted, the output Z is asserted. After the output has been asserted, the output returns to NULL only when all inputs return to NULL. FIG. 4b illustrates a threshold gate 410 wherein a symbol 491 is used to signify a four-input function gate with feedback. The output line 493 is fed back as an input. In isolation, the function gate operates as a threshold-two gate without hysteresis. The output switches high when the number of high inputs is two or greater, and the output switches low when the number of high inputs is less than two. With feedback, the output signal Z becomes an input, and the circuit has the desired hysteresis. For example, after the output has been asserted and the number of asserted inputs drops to one, the feedback line provides a second asserted input to hold the threshold function gate to an asserted output. The threshold function gate 491 switches to NULL when all independent inputs A, B, C, become NULL.

Figure 4C:
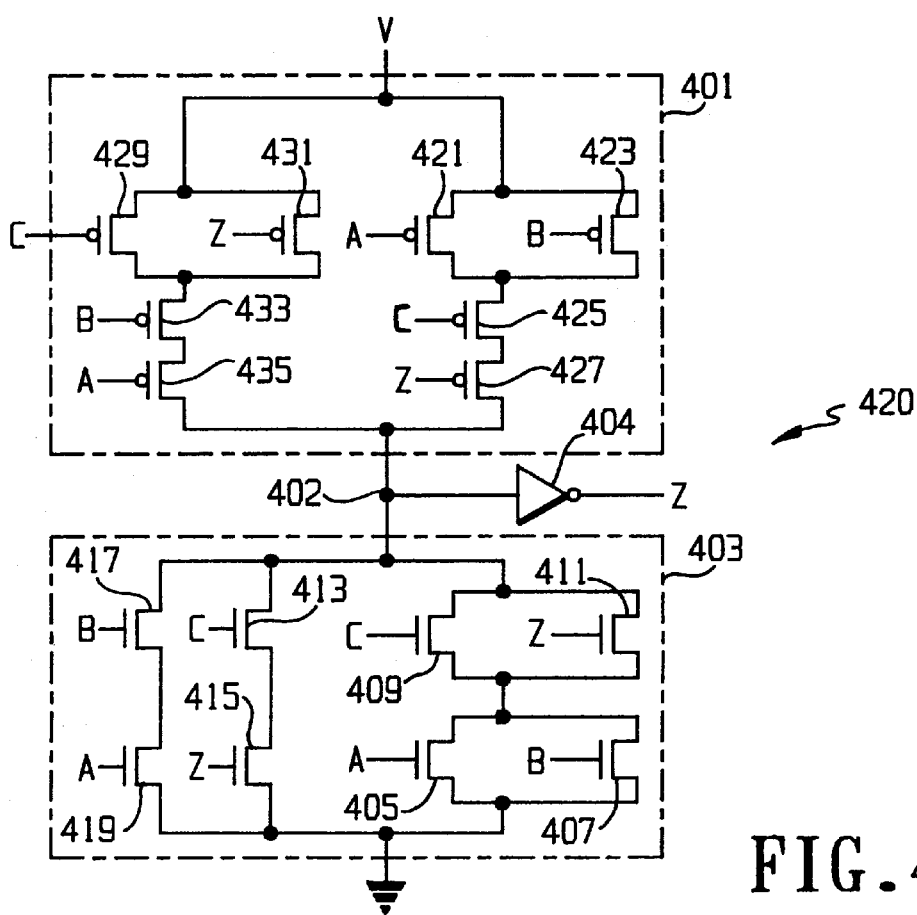

FIG. 4c illustrates a transistor-level circuit diagram 420 of a static CMOS implementation for gate 400 of FIG. 4a. The circuit 420 includes a pull-up sub-circuit 401, a pull-down subcircuit 403 and an inverting driver 404 connected at a common signal junction 402.

In the pull-up sub-circuit, the A input is connected to PMOS transistors 421 and 435. The B input is connected to PMOS transistors 423 and 433. The C input is connected to PMOS transistors 425 and 429. The feedback input, Z, is connected to PMOS transistors 427 and 431. The PMOS transistors 429, 431, 421 and 423 are connected to VDD. The PMOS transistors 435 and 427 are connected to the node 402. The PMOS transistor 433 is connected in series with the PMOS transistor 435 and the parallel PMOS transistors 429 and 431. The PMOS transistor 425 is connected in series with the PMOS transistor 427 and the parallel PMOS transistors 421 and 423.

In the pull-down sub-circuit, the A input is connected to NMOS transistors 405 and 419. The B input is connected to NMOS transistors 407 and 417. The C input is connected to NMOS transistors 409 and 413. The feedback signal, Z, is connected to NMOS transistors 411 and 415. The NMOS transistors 419, 415, 405 and 407 are connected to GND. The NMOS transistors 417, 413, 409 and 411 are connected to node 402. The NMOS transistors 417 and 419 form a series connection between GND and node 402. The NMOS transistors 413 and 415 form a series connection between GND and node 402. The parallel NMOS transistors 409 and 411 form a series connection with the parallel NMOS transistors 405 and 407 between GND and node 402.

The pull-up sub-circuit 401 implements the function for generating a NULL output. Assume that Z is initially in an asserted state. The output, Z, is set to NULL when all three input signals, A, B and C, are NULL. When A, B and C are NULL, the series connection of PMOS transistors, 435, 433 and 429, is turned on, pulling node 402 to VDD which pulls Z to GND.

The output, Z, is maintained at NULL through the hysteretic behavior of the threshold gate which is provided by the feedback PMOS transistors, 427 and 431. These transistors maintain node 402 at VDD as long as two of the three inputs, A, B or C, remains in the NULL state. When A, B and Z are NULL, the series connection of PMOS transistors, 435, 433 and 431, is turned on, maintaining node 402 at VDD which maintains Z at GND. When A, C and Z are NULL, the series connection of PMOS transistors, 421, 425 and 427, is turned on, maintaining node 402 at VDD which maintains Z at GND. When B, C and Z are NULL, the series connection of NMOS transistors, 423, 425 and 427, is turned on, maintaining node 402 at VDD which maintains Z at GND. It should be appreciated that all of the four pull-up pathways, connecting node 402 to VDD, can be turned on at any given time depending upon the state of the inputs, A, B and C, and the state of the output, Z.

The pull-down sub-circuit 403 implements the function for generating an asserted output. Assume that Z is initially in a NULL state. The output, Z, is asserted when any two of the three input signals, A, B and C, are asserted. When A and B are asserted, the series connection of NMOS transistors, 419 and 417, is turned on, pulling node 402 to GND which pulls Z to VDD. When A and C are asserted, the series connection of NMOS transistors, 405 and 409, is turned on, pulling node 402 to GND which pulls Z to VDD. When B and C are asserted, the series connection of NMOS transistors, 407 and 409, is turned on, pulling node 402 to GND which pulls Z to VDD.

The assertion of Z is maintained through the hysteretic behavior of the threshold gate which is provided by the feedback NMOS transistors, 411 and 415. These transistors maintain node 402 at GND as long as one of the three inputs, A, B or C, remains in the asserted state. When A and Z are asserted, the series connection of NMOS transistors, 405 and 411, is turned on, maintaining node 402 at GND which maintains Z at VDD. When B and Z are asserted, the series connection of NMOS transistors, 407 and 411, is turned on, maintaining node 402 at GND which maintains Z at VDD. When C and Z are asserted, the series connection of NMOS transistors, 413 and 415, is turned on, maintaining node 402 at GND which maintains Z at VDD. It should be appreciated that several of the six pull-down pathways, connecting node 402 to GND, can be turned on at any given time depending upon the state of the inputs, A, B and C, and the state of the output, Z.

It should be appreciated from the description above that a variety of transistor arrangements are possible for the two-of-three NULL convention gate. It should also be appreciated that a wide variety of NULL convention gates can be made with varying numbers of inputs and varying threshold levels.

To reiterate, NULL convention threshold gates respond to multiple inputs to generate an output as input logic signals propagate through the circuit. The multiple inputs each have an asserted state and a NULL state. NULL convention threshold gates switch an output to an asserted state when the number of asserted inputs meets or exceeds a threshold number. NULL convention threshold gates switch an output to the NULL state only after all inputs have returned to NULL. Further information regarding NULL convention threshold gates can be found in U.S. patent application Ser. No. 08/318,510, which is incorporated here by reference. Certain aspects are reiterated here for convenience.

Threshold gates include a "go-to-NULL" network, a "go-to-data" network and an output circuit such as an inverter. Threshold gates can also include a reset capability. For example, registers can be created using a 2-of-2 threshold gate with a reset capability. The reset capability is provided by a set/reset network that is included in the threshold gate implementation. The set/reset network initializes the state of the threshold gate upon the assertion of a reset signal. The set/reset network provides only initialization capabilities and is transparent to the intended functioning of the threshold gate during normal wavefront processing.

Figure 5:
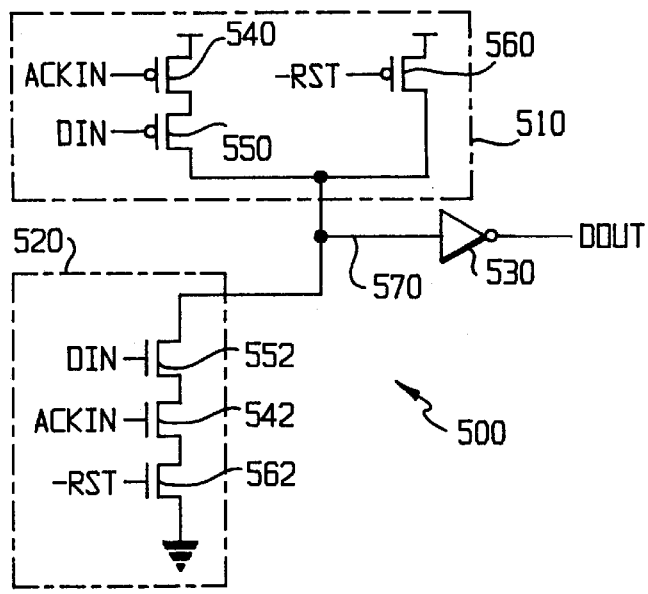
FIG. 5 illustrates a NULL convention asynchronous register, two-of-two threshold gate with active-low reset to NULL.

FIG. 5 illustrates an asynchronous register 500 for NULL convention logic systems implemented using a dynamic threshold gate. The register 500 of FIG. 9 consists of a pull-up network 510, a pull-down network 520 and an output inverter 530 which are connected at the common node 570. The register 500 includes a set/reset network, PMOS transistor 560 and NMOS transistor 562.

The acknowledge signal ACKIN acts as a gatekeeper which allows the DIN to be passed to the next logic stage. The ACKIN signal provides the current registration stage with information concerning the current state of the next registration stage. The ACKIN signal informs the current registration state as to whether or not the next registration stage has resolved its current computation. When -RST is low (low-level voltage, GND), the output, DOUT, will be reset to NULL, via the RST PMOS transistor 560. The -RST NMOS transistor 562 is used to eliminate the possibility of a VDD-to-GND short during the assertion of RST. The -RST signal provides data initialization and serves no other functional purpose. In the following description, the -RST signal will be assumed to be in its inactive state (i.e., high-level voltage, VDD), so that PMOS transistor 560 is off and NMOS transistor 562 is on.

When ACKIN is asserted, it is referred to as a "request-for-data" (RFD). If ACKIN asserts a RFD and DIN is data, the series connection of NMOS transistors, 542 and 552, is turned on and data is passed to the output, DOUT, of the threshold gate 500. When ACKIN is NULL, it is referred to as a "request-for-NULL" (RFN). If ACKIN asserts a RFN and DIN is NULL, the series connection of PMOS transistors, 540 and 550, is turned on and a NULL is passed to the output, DOUT, of the threshold gate 500. It should be appreciated that the hysteretic behavior is provided, in dynamic threshold gate implementations, by the capacitance at node 570.

Figure 6:
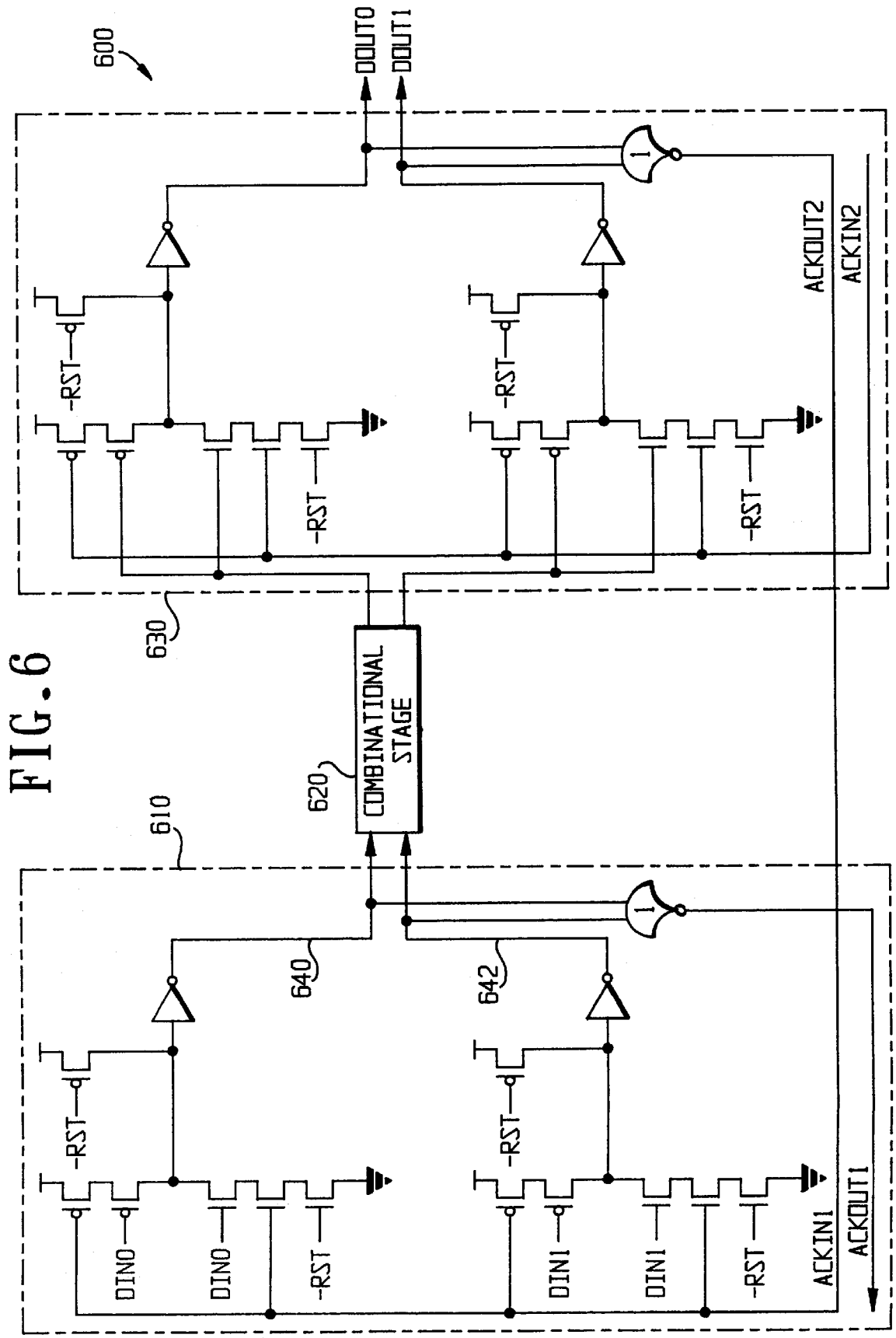
FIG. 6 illustrates a NULL convention sequential circuit consisting of asynchronous combinational and registration logic.

FIG. 6 shows the acknowledge signaling protocol for two asynchronous registration stages 600. By way of example, FIG. 6 employs the dual-rail encoding scheme consistent with binary logic implementations of NULL convention logic systems. The Combinational Stage 620 is composed of any number and combination of threshold gates used for data evaluation.

As FIG. 6 shows, the ACKIN1 signal of the first registration stage 610 is provided by the ACKOUT2 signal of the second registration stage 630. It should be appreciated that ACKIN1 and ACKOUT2 represent a common signal that has been named in this manner to facilitate understanding. When either DOUT0 or DOUT1 become data, the ACKOUT2 signal asserts a RFN. When both DOUT0 and DOUT1 become NULL, the ACKOUT2 signal asserts a RFD. The assertion of the ACKOUT2 signal allows the inputs to the first registration stage 610, DIN0 and DIN1, to pass to the outputs 640, 642, respectively, of the first registration stage 610. For example, if ACKOUT2 asserts a RFN, when DIN0 and DIN1 are NULL, a NULL is passed to the register outputs 640, 642. The ACKOUT1 and ACKIN2 signals also participate in the acknowledgement protocol and are accepted/produced by the registration stages which are located upstream and downstream, respectively, of the two registration stages 610, 630 shown in FIG. 6.

Figure 7:
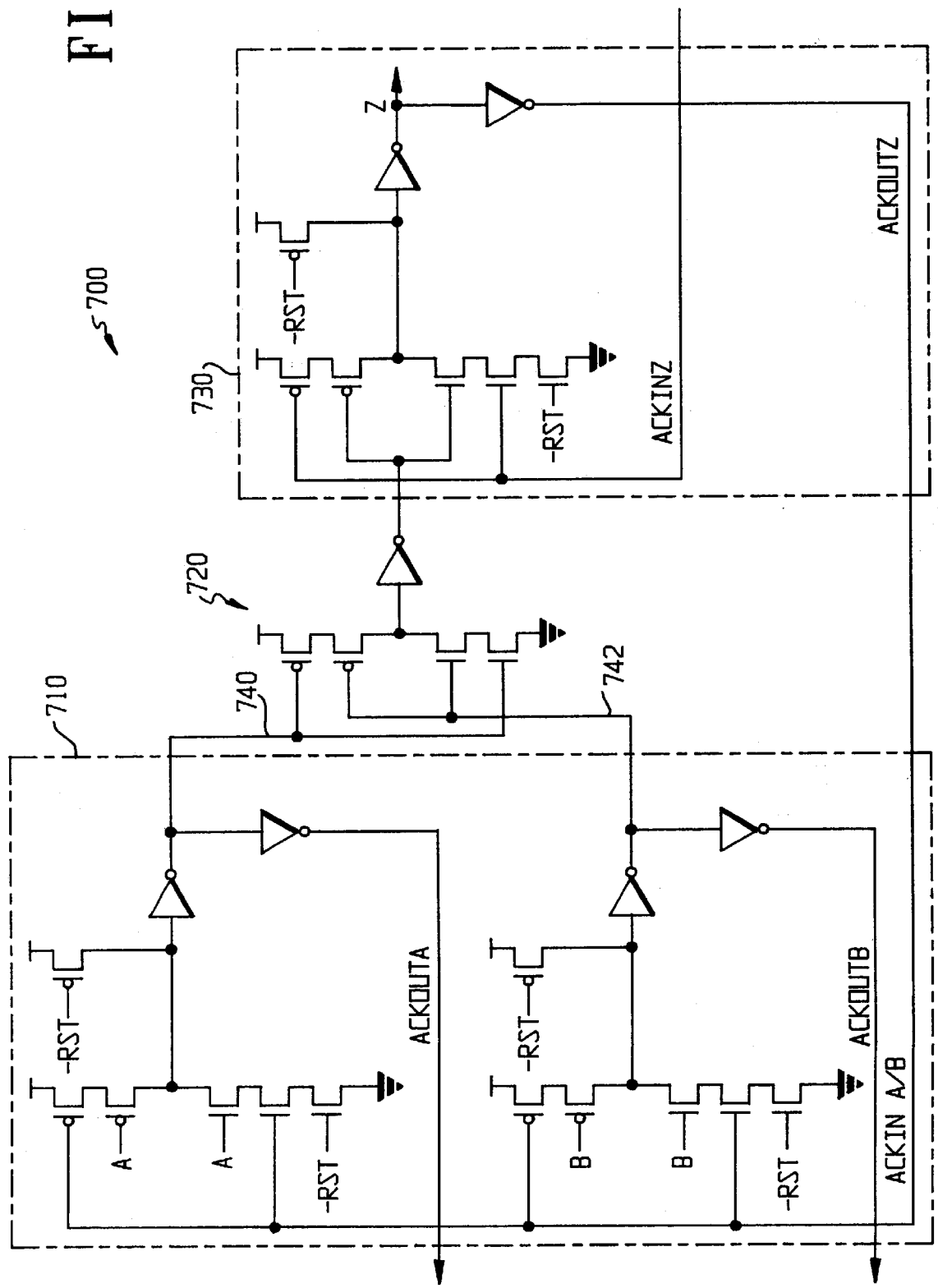
FIG. 7 illustrates a NULL convention two-of-two threshold gate with registered inputs and output.

FIG. 7 shows a circuit 700 which demonstrates the acknowledge signaling protocol for evaluating a two-of-two threshold function 720 where the output is passed to a registration stage 730 and the inputs come from a registration stage 710. The circuit 700 in FIG. 7 works in the same manner as the circuit 600 discussed with reference to FIG. 6. The ACKOUTZ signal will assert a RFN or a RFD, depending upon the logical value of the register output Z. It should be appreciated that ACKIN A/B and ACKOUTZ represent a common signal that has been named in this manner to facilitate understanding. When ACKOUTZ asserts a RFD, the input signals, A and B, are passed to the outputs 740, 742 of the first registration stage 710 when the input signals, A and B, become data. When ACKOUTZ asserts a RFN, the input signals, A and B, are passed to the outputs 740, 742 of the first registration stage 710 when the input signals, A and B, become NULL. The signals ACKOUTA, ACKOUTB and ACKINZ are also used in the acknowledgement protocol and interact with registration stages upstream and downstream of the two registration stages 710, 730 shown in FIG. 7.

The acknowledgment convention used in NULL convention logic requires that every registration stage must acknowledge the source of its data inputs. In the examples illustrated in FIGS. 6 and 7, the acknowledgment of the first registration stage 610/710 is performed using a single acknowledge signal, ACKOUT2, ACKOUTZ, from the second registration stage 630/730. Only a single acknowledge signal, ACKOUT2, ACKOUTZ, is required because the outputs 640/740, 642/742 of the first registration stage are associated only with the input of a single registration stage, i.e., the second registration stage 630/730.

Figure 8:
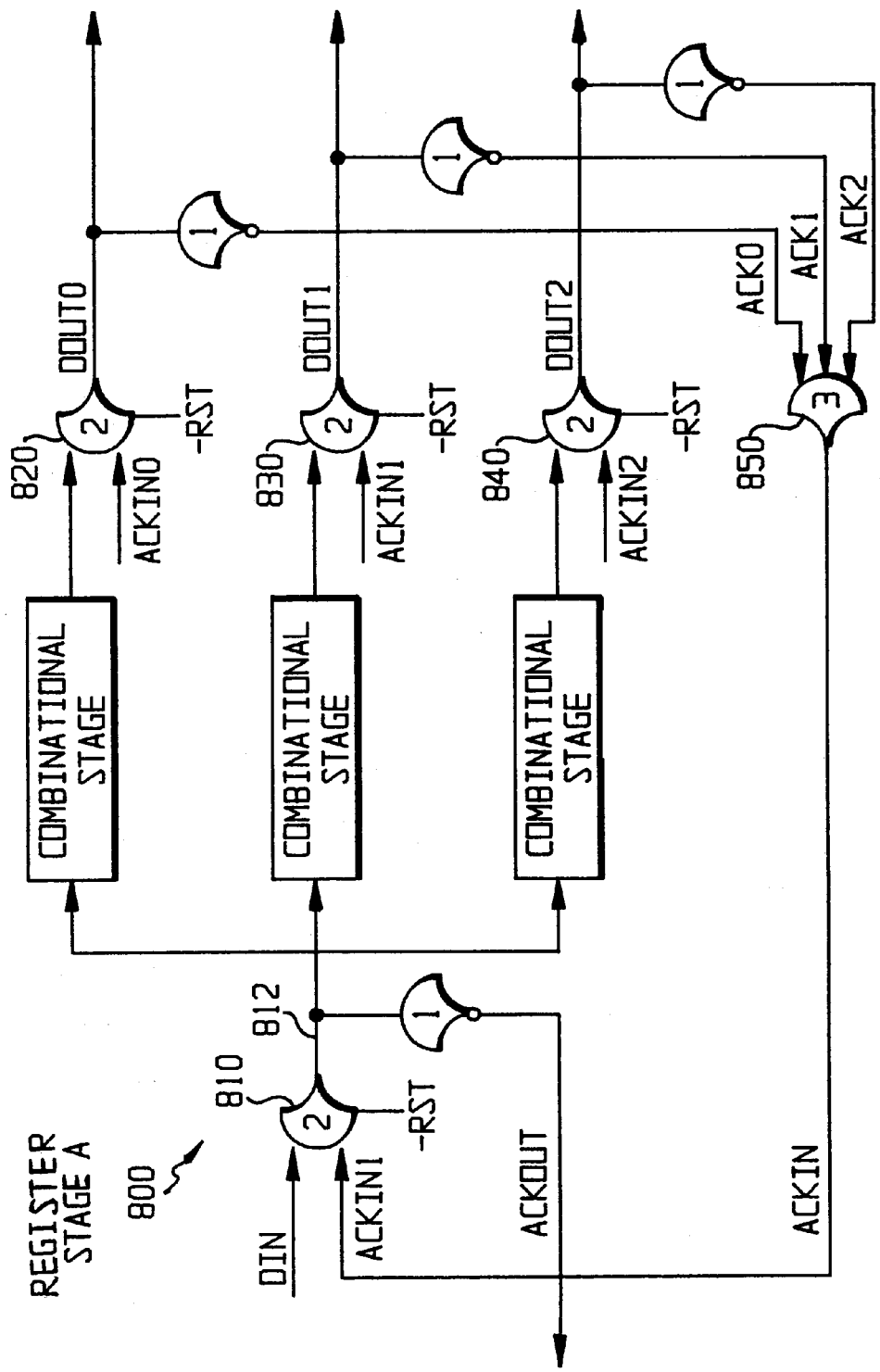
FIG. 8 illustrates three asynchronous registers acknowledging a single asynchronous register.

In many cases, a single registration stage is acknowledged by two or more independent registration stages (fan-out). In these cases, multiple acknowledge signals must be collected and resolved to a single acknowledge signal, which is then passed to the single registration stage. FIG. 8 shows a circuit diagram 800 wherein a single register 810 is acknowledged by three registers 820, 830, 840, i.e., a fan-out of 3.

In FIG. 8, the three acknowledge signals, ACK0, ACK1 and ACK2, are collected by a 3-of-3 threshold gate 850 (assuming that all three signals must be asserted). The 3-of-3 threshold gate 850 resolves the three acknowledge signals, ACK0, ACK1 and ACK2, to produce a single acknowledge signal, ACKIN, which is then passed to Registration Stage A 810 as an incoming acknowledge signal. Registration Stage A 810 maintains the same protocol as registration stages 610, 630 and 710, 730, with references to FIG. 6 and FIG. 7, respectively, for passing DIN to the register output 812, with respect to the incoming acknowledge signal, ACKIN.

According to the present invention, the process of collecting and resolving acknowledge signals to a single signal can be more efficiently realized using acknowledge collection that is embedded in the register gate.

Figure 9:
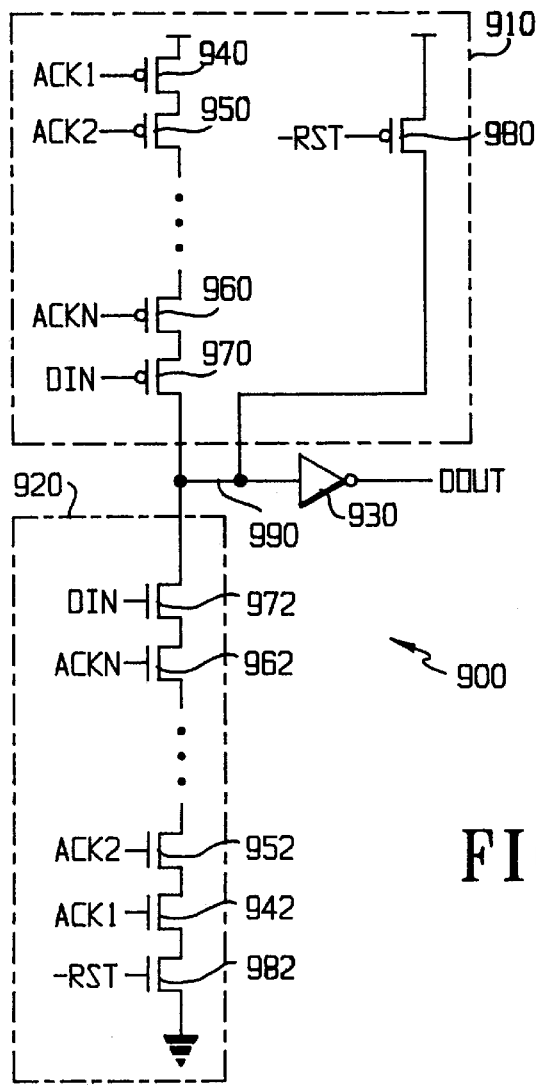
FIG. 9 illustrates an asynchronous register, N-of-N embedded acknowledge collection.
Figure 10:
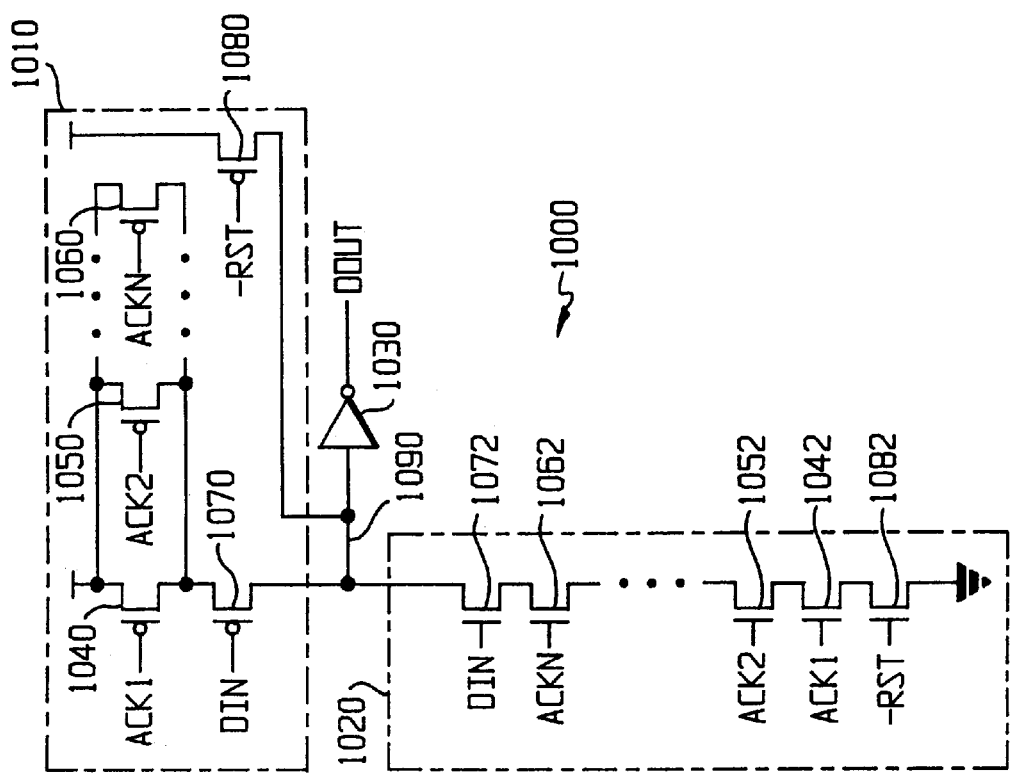
FIG. 10 illustrates an asynchronous register, 1-of-N embedded acknowledge collection.

FIG. 9 shows an asynchronous register with N-of-N embedded acknowledge collection 900. FIG. 10 shows an asynchronous register with one-of-N embedded acknowledge collection 1000. It should be appreciated that it is also possible to perform a M-of-N (M is less than or equal to N) acknowledge collection.

The register 900 of FIG. 9 consists of a pull-up network 910, a pull-down network 920 and an output inverter 930 which are connected at the common node 990. The register 900 includes a set/reset network, PMOS transistor 980 and NMOS transistor 982, that is assumed to be transparent (-RST is set to a high-voltage level, VDD).

The register allows DIN to pass as data to the output, DOUT, after all N acknowledge signals, ACK1, ACK2, . . . , ACKN, assert a RFD. The assertion of all of the input signals in the pull-down sub-circuit 920 causes the series connection of NMOS transistors, including 942, 952, 962, 972 and 982, to turn on, pulling node 990 to GND which pulls DOUT to VDD.

The register 900 allows DIN to pass as NULL only after all N acknowledge signals, ACK1, ACK2, . . . , ACKN, assert a RFN. When all of the input signals in the pull-up sub-circuit are NULL, the series connection of PMOS transistors, including 940, 950, 960 and 970, is turned on, pulling 990 to VDD which pulls DOUT to GND. It should be appreciated that the hysteretic behavior is provided, in dynamic threshold gate implementations, by the capacitance at node 990.

The register 1000 of FIG. 10 consists of a pull-up network 1010, a pull-down network 1020 and an output inverter 1030 which are connected at the common node 1090. The register 1000 includes a set/reset network, PMOS transistor 1080 and NMOS transistor 1082, that is assumed to be transparent (-RST is set to a high-voltage level, VDD).

The register 1000 works in the same manner as register 900, with reference to FIG. 9, with the exception that only one of the acknowledge signals, ACK1, ACK2, . . . , ACKN, must assert a RFN before DIN is passed to DOUT as NULL. Node 1090 is pulled to VDD which pulls DOUT to GND when the PMOS transistor 1070 is turned on and one of the acknowledge transistors, including PMOS transistors 1040, 1050 and 1060, is turned on.

Figure 11:
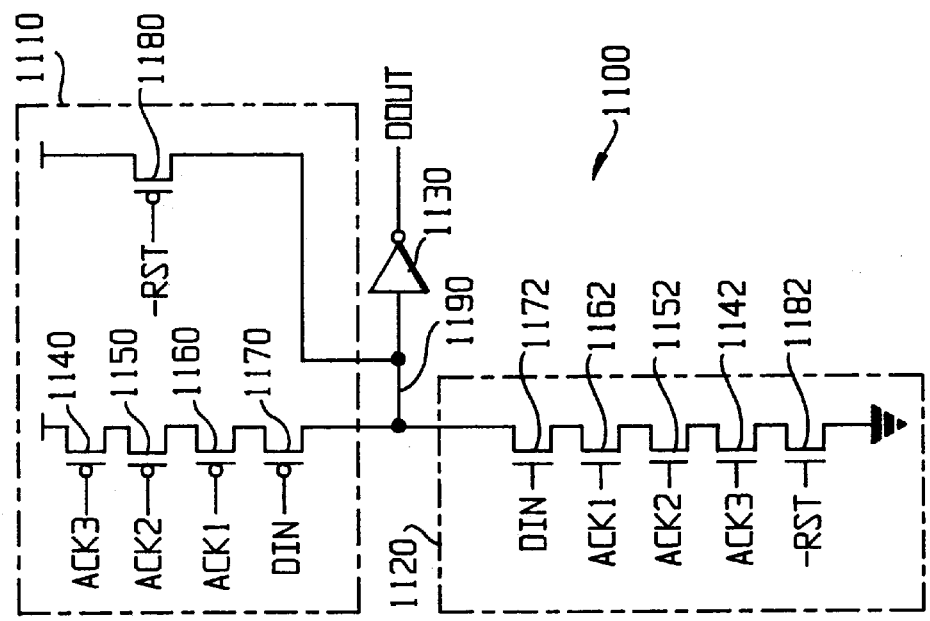
FIG. 11 illustrates an asynchronous register, 3-of-3 embedded acknowledge collection.

The register 1100 of FIG. 11 consists of a pull-up network 1110, a pull-down network 1120 and an output inverter 1130 which are connected at the common node 1190. The register 1100 includes a set/reset network, PMOS transistor 1180 and NMOS transistor 1182, that is assumed to be transparent (-RST is set to a high-voltage level, VDD).

The asynchronous register 1100 performs a three-of-three acknowledge collection, in addition to performing registration. The threshold gate that results from embedding the three-of-three acknowledge collection is a four-of-four threshold gate.

When all three acknowledge signals, ACK1, ACK2 and ACK3, assert a RFD and DIN is asserted, data is passed to DOUT. The assertion of ACK1, ACK2, ACK3 and DIN causes the series connection of NMOS transistors, 1142, 1152, 1162 and 1172, to turn on, pulling node 1190 to GND which pulls DOUT to VDD.

When ACK1, ACK2 and ACK3 assert a RFN and DIN is NULL, a NULL is passed to DOUT. A NULL on ACK1, ACK2, ACK3 and DIN causes the series connection of PMOS transistors, 1140, 1150, 1160 and 1170, to turn on, pulling node 1190 to VDD which pulls DOUT to GND.

Figure 12:
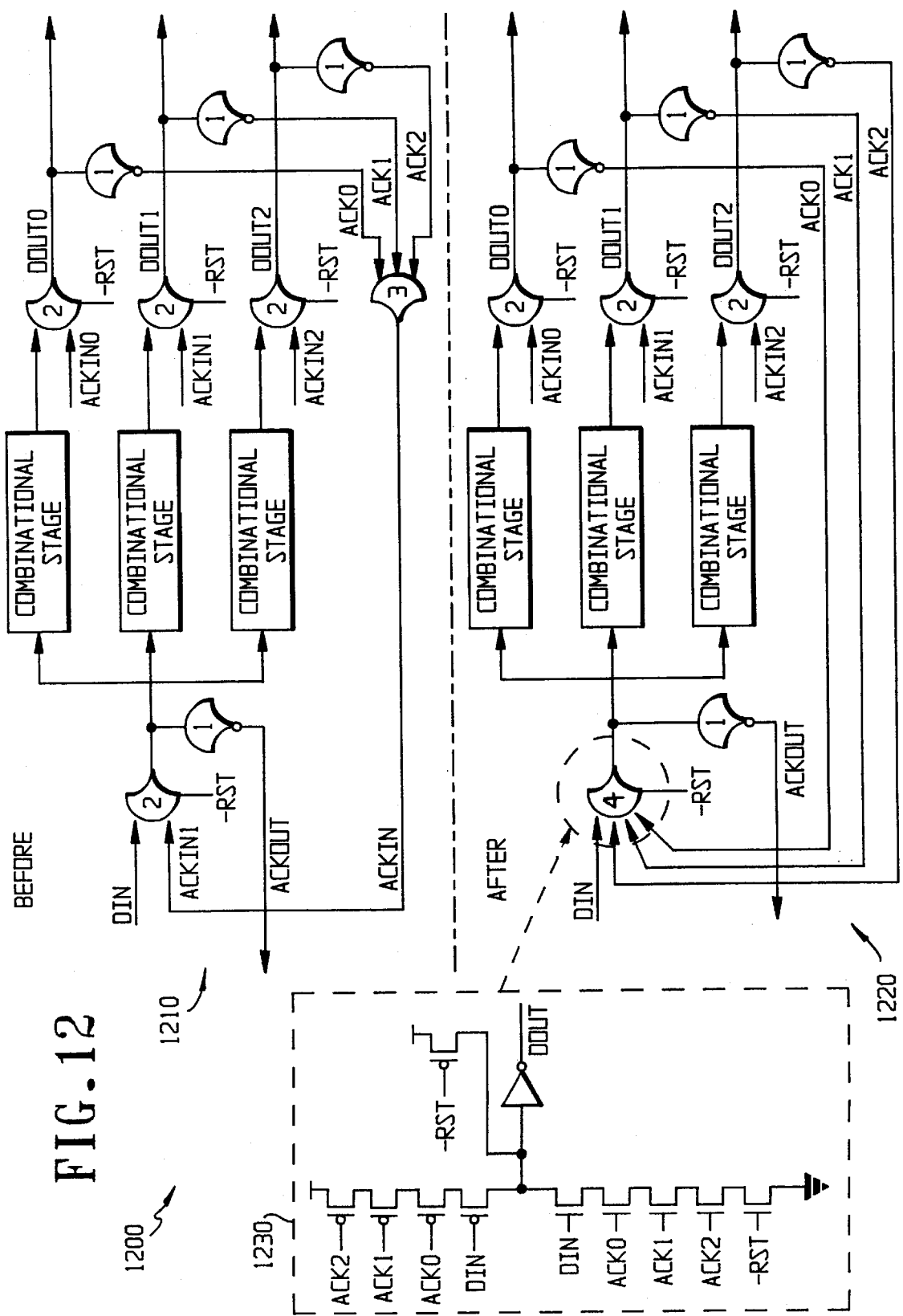
FIG. 12 illustrates the circuit of FIG. 8 implemented using an asynchronous register with embedded acknowledge collection and resolution.

It should be appreciated that the register 1100 shown in FIG. 11 can be used in the example shown in FIG. 8. FIG. 12 shows the register structure 1200 of FIG. 8 both before 1210 and after 1220 embedded acknowledge collection. The register 1100 in FIG. 11 would replace the three-of-three threshold gate 850 which performs the acknowledge collection, and the Registration Stage A 810 which performs the data registration. The replacement gate 1230 is shown in FIG. 12.

In summary, an asynchronous register that reduces the levels of data processing necessary for acknowledgment resolution has been disclosed. The asynchronous register includes embedded acknowledge collection for reducing the number of active elements required to perform acknowledge collection and resolution.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An asynchronous register, comprising:
    a data threshold circuit for generating data or NULL values at an output signal line based upon an evaluation of at least one data input value; and
    an acknowledgment collection circuit, embedded in the data threshold circuit, for collecting a plurality of acknowledge signals and resolving the acknowledge signals for controlling, in combination with the at least one data input value, the passing of the data or NULL values to the output signal line.

2. The asynchronous register of claim 1 wherein the acknowledgment collection circuit comprises an M of N is acknowledge collection circuit, wherein M is less than or equal to N, N is an integer representing the number of acknowledge signals being resolved, M is an integer representing the number of acknowledge signals required for resolution and the M of N acknowledge collection circuit allows the at least one data input value to pass as data to the output signal line after all M acknowledge signals assert a request for data.

3. The asynchronous register of claim 2 wherein the M of N acknowledge collection circuit allows the at least one data input value to pass as NULL to the output signal line after P of N acknowledge signals assert a request for NULL.

4. The asynchronous register of claim 1 further comprising a reset network for providing system initialization at registration boundaries.

5. The asynchronous register of claim 4 wherein the reset network is made transparent during normal operating conditions.

6. An asynchronous register, comprising:
    a data threshold circuit for generating data or NULL values at an output signal line based upon an evaluation of at least one data input value having an asserted state or a NULL state; and
    an acknowledgment collection circuit, embedded in the data threshold circuit, for determining a current state of N next registers based upon N acknowledge signals received from the N next registers, the N acknowledgment signals each representing a request for data or a request for NULL;
        wherein the acknowledgment collection circuit further comprises a hysteresis circuit passing the at least one data input signals to the output signal line as data when a threshold number M of the acknowledge signals assert a request for data, wherein M is less than or equal to N.

7. The asynchronous register of claim 6 wherein the hysteresis circuit passes the at least one data input signals to the output signal line as NULL when a threshold number P of the acknowledge signals assert a request for NULL, wherein P is less than or equal to N.

8. The asynchronous register of claim 7 wherein P is equal to M.

9. The asynchronous register of claim 7 wherein P is not equal to M.

10. The asynchronous register of claim 6 further comprising a reset network for providing system initialization at registration boundaries.

11. The asynchronous register of claim 10 wherein the reset network is made transparent during normal operating conditions.

* * * * *